United States Patent
Woodruff et al.

(10) Patent No.: US 6,749,391 B2
(45) Date of Patent: *Jun. 15, 2004

(54) MICROELECTRONIC WORKPIECE TRANSFER DEVICES AND METHODS OF USING SUCH DEVICES IN THE PROCESSING OF MICROELECTRONIC WORKPIECES

(75) Inventors: Daniel J. Woodruff, Kalispell, MT (US); Randy Harris, Kalispell, MT (US)

(73) Assignee: Semitool, Inc., Kalispell, MT (US)

(*) Notice: Subject to any disclaimer, the term of this patent is extended or adjusted under 35 U.S.C. 154(b) by 7 days.

This patent is subject to a terminal disclaimer.

(21) Appl. No.: 10/080,910

(22) Filed: Feb. 22, 2002

(65) Prior Publication Data

US 2002/0102156 A1 Aug. 1, 2002

Related U.S. Application Data

(60) Continuation-in-part of application No. 09/875,428, filed on Jun. 5, 2001, and a continuation-in-part of application No. 09/875,300, filed on Jun. 5, 2001, and a continuation-in-part of application No. 09/618,707, filed on Jul. 18, 2000, now Pat. No. 6,654,122, and a continuation-in-part of application No. 09/386,566, filed on Aug. 31, 1999, now Pat. No. 6,318,951, which is a continuation of application No. PCT/US99/15567, filed on Jul. 9, 1999, and a continuation-in-part of application No. 08/990,107, filed on Dec. 15, 1997, now Pat. No. 6,672,820, which is a division of application No. 08/680,056, filed on Jul. 15, 1996, now abandoned.

(51) Int. Cl.[7] ............................................. B66C 23/00

(52) U.S. Cl. .................. 414/744.5; 414/744.5

(58) Field of Search .............. 414/744.1, 744.3, 414/744.5, 806

(56) References Cited

U.S. PATENT DOCUMENTS

| 1,526,644 A | 2/1925 | Phinney |
| 1,881,713 A | 10/1932 | Laukel |
| 2,256,274 A | 9/1941 | Boedecker et al. |
| 4,046,105 A | 9/1977 | Gomez |
| 4,304,641 A | 12/1981 | Grandia et al. |

(List continued on next page.)

FOREIGN PATENT DOCUMENTS

| WO | WO 00/61498 | 10/2000 |
| WO | WO 00/61837 | 10/2000 |
| WO | WO 01/90434 | 11/2001 |
| WO | WO 02/097165 | 12/2002 |
| WO | WO 02/099165 | 12/2002 |

OTHER PUBLICATIONS

U.S. patent application Ser. No. 09/679,928, Woodruff et al., filed Oct. 5, 2000.

(List continued on next page.)

*Primary Examiner*—Donald W. Underwood
(74) *Attorney, Agent, or Firm*—Perkins Coie LLP

(57) ABSTRACT

Microelectronic workpiece transfer devices and methods for using such transfer devices. One embodiment of a transfer device includes a transport unit configured to move along a linear track and a lift assembly carried by the transport unit. The transfer device can also include an arm assembly having an arm actuator carried by the lift assembly to move along a lift path and an arm carried by the arm actuator to rotate about the lift path. The arm can include an extension projecting from one side of the lift path. The arm actuator can rotate the arm about the lift path. The transfer device can also include a first end-effector and a second end-effector. The end-effectors are rotatably coupled to the extension of the arm and can rotate independently about a common axis, with the first and second end-effectors at different elevations relative to the arm.

3 Claims, 11 Drawing Sheets

U.S. PATENT DOCUMENTS

| | | | |
|---|---|---|---|
| 4,451,197 A | 5/1984 | Lange | |
| 4,495,453 A | 1/1985 | Inaba et al. | |
| 4,566,847 A | 1/1986 | Maeda et al. | |
| 4,634,503 A | 1/1987 | Nogavich | |
| 4,639,028 A | 1/1987 | Olson | |
| 4,648,944 A | 3/1987 | George et al. | |
| 4,670,126 A | 6/1987 | Messer et al. | |
| 4,760,671 A | 8/1988 | Ward | |
| 4,761,214 A | 8/1988 | Hinman | |
| 4,770,590 A | 9/1988 | Hughes et al. | |
| 4,828,654 A | 5/1989 | Reed | |
| 4,902,398 A | 2/1990 | Homstad | |
| 4,944,650 A | 7/1990 | Masumoto | |
| 4,949,671 A | 8/1990 | Davis et al. | |
| 4,988,533 A | 1/1991 | Freeman et al. | |
| 5,000,827 A | 3/1991 | Schuster et al. | |
| 5,061,144 A | 10/1991 | Akimoto et al. | |
| 5,135,636 A | 8/1992 | Yee et al. | |
| 5,138,973 A | 8/1992 | Davis et al. | |
| 5,156,174 A | 10/1992 | Thompson et al. | |
| 5,156,730 A | 10/1992 | Bhatt et al. | |
| 5,178,512 A | 1/1993 | Skrobak | |
| 5,217,586 A | 6/1993 | Datta et al. | |
| 5,222,310 A | 6/1993 | Thompson et al. | |
| 5,227,041 A | 7/1993 | Brogden et al. | |
| 5,256,274 A | 10/1993 | Poris | |
| 5,314,294 A * | 5/1994 | Taniguchi et al. | 414/744.5 X |
| 5,344,491 A | 9/1994 | Katou | |
| 5,368,711 A | 11/1994 | Poris | |
| 5,376,176 A | 12/1994 | Kuriyama | |
| 5,377,708 A | 1/1995 | Bergman et al. | |
| 5,442,416 A | 8/1995 | Tateyama et al. | |
| 5,460,478 A | 10/1995 | Akimoto et al. | |
| 5,571,325 A * | 11/1996 | Ueyama et al. | 414/940 X |
| 5,639,206 A | 6/1997 | Oda et al. | |
| 5,670,034 A | 9/1997 | Lowery | |
| 5,681,392 A | 10/1997 | Swain | |
| 5,684,713 A | 11/1997 | Asada et al. | |
| 5,700,127 A | 12/1997 | Harada et al. | |
| 5,711,646 A | 1/1998 | Ueda et al. | |
| 5,723,028 A | 3/1998 | Poris | |
| 5,746,565 A | 5/1998 | Tepolt | |
| 5,754,842 A | 5/1998 | Minagawa | |
| 5,759,006 A | 6/1998 | Miyamoto et al. | |
| 5,765,444 A | 6/1998 | Bacchi et al. | |
| 5,765,889 A | 6/1998 | Nam et al. | |
| 5,785,826 A | 7/1998 | Greenspan | |
| 5,980,706 A | 11/1999 | Bleck et al. | |
| 5,985,126 A | 11/1999 | Bleck et al. | |
| 5,989,397 A | 11/1999 | Laube et al. | |
| 5,999,886 A | 12/1999 | Martin et al. | |
| 6,004,828 A | 12/1999 | Hanson | |
| 6,027,631 A | 2/2000 | Broadbent | |
| 6,028,986 A | 2/2000 | Song | |
| 6,074,544 A | 6/2000 | Reid et al. | |
| 6,090,260 A | 7/2000 | Inoue et al. | |
| 6,091,498 A | 7/2000 | Hanson et al. | |
| 6,110,346 A | 8/2000 | Reid et al. | |
| 6,151,532 A | 11/2000 | Barone et al. | |
| 6,156,167 A | 12/2000 | Patton et al. | |
| 6,159,354 A | 12/2000 | Contolini et al. | |
| 6,162,344 A | 12/2000 | Reid et al. | |
| 6,162,488 A | 12/2000 | Gevelber et al. | |
| 6,168,695 B1 | 1/2001 | Woodruff et al. | |
| 6,179,983 B1 | 1/2001 | Reid et al. | |
| 6,193,859 B1 | 2/2001 | Contolini et al. | |
| 6,199,301 B1 | 3/2001 | Wallace | |
| 6,234,738 B1 * | 5/2001 | Kimata et al. | 414/744.3 X |
| 6,481,956 B1 * | 11/2002 | Hofmeister | 414/744.5 X |
| 2002/0008037 A1 | 1/2002 | Wilson et al. | |
| 2002/0125141 A1 | 9/2002 | Wilson et al. | |
| 2002/0139678 A1 | 10/2002 | Wilson et al. | |

OTHER PUBLICATIONS

U.S. patent application Ser. No. 60/129,055, McHugh, filed Apr. 13, 1999.

U.S. patent application Ser. No. 60/143,769, McHugh, filed Jul. 12, 1999.

U.S. patent application Ser. No. 60/182,160, McHugh et al., filed Feb. 14, 2000.

U.S. patent application Ser. No. 60/206,663, Wilson et al., filed May 24, 2000.

Lee, Tien–Yu Tom et al., "Application of a CFD Tool in Designing a Fountain Plating Cell for Uniform Bump Plating of Semiconductor Wafers," IEEE Transactions On Components, Packaging and Manufacturing Technology—Part B, Feb. 1996, pp 131–137, vol. 19, No. 1, IEEE.

Lowenheim, Frederick A., "Electroplating," Jan. 1979, 12 pgs, McGraw–Hill Book Company, USA.

Ritter, G., et al., "Two–And Three–Dimensional Numerical Modeling of Copper Electroplating for Advanced ULSI Metallization," Jun. 1999, 13 pgs, E–MRS Conference Symposium M. *Basic Models to Enhance Reliability*, Strasbourg, France.

PCT International Search Report for PCT/US02/17840, Applicant: Semitool, Inc., Mar. 2003, 5 pgs.

* cited by examiner

MICROELECTRONIC WORKPIECE TRANSFER DEVICES AND METHODS OF USING SUCH DEVICES IN THE PROCESSING OF MICROELECTRONIC WORKPIECES

CROSS-REFERENCE TO RELATED APPLICATIONS

This application is a continuation-in-part of: (1) pending U.S. patent application Ser. No. 09/875,300, entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed Jun. 5, 2001; and (2) pending U.S. patent application Ser. No. 09/875,428, entitled "INTEGRATED TOOLS WITH TRANSFER DEVICES FOR HANDLING MICROELECTRONIC WORKPIECES," filed Jun. 5, 2001; both of which are continuations-in-part of (3) pending U.S. patent application Ser. No. 08/990,107, entitled "ROBOTS FOR MICROELECTRONIC WORKPIECE HANDLING," filed on Dec. 15, 1997 now U.S. Pat. No. 6,672,820 and U.S. patent application Ser. No. 09/386,566, filed Aug. 31, 1999, entitled "IMPROVED ROBOT FOR MICROELECTRONIC WORKPIECE HANDLING," which is a continuation of International Patent Application No. PCT/US99/15567, filed Jul. 9, 1999, designating the U.S., entitled "ROBOTS FOR MICROELECTRONIC WORKPIECE HANDLING," which application claims priority from U.S. patent application Ser. No. 09/114,105, filed Jul. 11, 1998 entitled "ROBOT FOR MICROELECTRONIC WORKPIECE HANDLING," now abandoned, and (3) U.S. application Ser. No. 09/618,707 filed Jul. 18, 2000, now U.S. Pat. No. 6,654,122, which is a divisional of U.S. application Ser. No. 08/680,056 filed Jul. 15, 1996 and now abandoned:

(a) U.S. patent application Ser. No. 10/080,914 entitled "METHOD AND APPARATUS FOR MANUALLY AND AUTOMATICALLY PROCESSING MICROELECTRONIC WORKPIECES," filed concurrently.

(b) U.S. patent application Ser. No. 10/080,915 entitled "APPARATUS WITH PROCESSING STATIONS FOR MANUALLY AND AUTOMATICALLY PROCESSING MICROELECTRONIC WORKPIECES," filed concurrently.

(c) U.S. patent application Ser. No. 09/875,304, entitled "DISTRIBUTED POWER SUPPLIES FOR MICROELECTRONIC WORKPIECE PROCESSING TOOLS," filed Jun. 5, 2001;

(d) U.S. patent application Ser. No. 09/875,365, entitled "ADAPTABLE ELECTROCHEMICAL PROCESSING CHAMBER," filed June 5, 2001;

(e) U.S. patent application Ser. No. 09/875,424, entitled "LIFT AND ROTATE ASSEMBLY FOR USE IN A WORKPIECE PROCESSING STATION AND A METHOD OF ATTACHING THE SAME," filed Jun. 5, 2001;

(f) U.S. patent application Ser. No. 09/872,151, entitled "APPARATUS AND METHODS FOR ELECTROCHEMICAL PROCESSING OF MICROELECTRONIC WORKPIECES," filed May 31, 2001; and (g) U.S. patent application Ser. No. 09/849,505, entitled "TUNING ELECTRODES USED IN A REACTOR FOR ELECTROCHEMICALLY PROCESSING A MICROELECTRONIC WORKPIECE," filed on May 4, 2001.

All of the foregoing Patent Applications identified by paragraphs (a)–(g) above are herein incorporated by reference.

TECHNICAL FIELD

The present invention relates to processing microelectronic workpieces and handling such workpieces within an environment of a processing machine.

BACKGROUND

Microelectronic devices, such as semiconductor devices and field emission displays, are fabricated on and/or in microelectronic workpieces using several different apparatus ("tools"). Many such processing apparatus have a single processing station that performs one or more procedures on the workpieces. Other processing apparatus have a plurality of processing stations that perform a series of different procedures on individual workpieces or batches of workpieces. The workpieces are generally handled within the processing apparatus by automatic handling equipment (i.e., robots) because microelectronic fabrication requires extremely clean environments, very precise positioning of the workpieces, and conditions that are not suitable for human access (e.g., vacuum environments, high temperatures, chemicals, etc.).

An increasingly important category of processing apparatus are plating tools that plate metals and other materials onto workpieces. Existing plating tools use automatic handling equipment to handle the workpieces because the position, movement and cleanliness of the workpieces are important parameters for accurately plating materials onto the workpieces. The plating tools can be used to plate metals and other materials (e.g., ceramics or polymers) in the formation of contacts, interconnects and other components of microelectronic devices. For example, copper plating tools are used to form copper contacts and interconnects on semiconductor wafers, field emission displays, read/write heads and other types of microelectronic workpieces. A typical copper plating process involves depositing a copper seed layer onto the surface of the workpiece using chemical vapor deposition (CVD), physical vapor deposition (PVD), electroless plating processes, or other suitable methods. After forming the seed layer, copper is plated onto the workpiece by applying an appropriate electrical field between the seed layer and an anode in the presence of an electrochemical plating solution. The workpiece is then cleaned, etched and/or annealed in subsequent procedures before transferring the workpiece to another apparatus.

Single-wafer plating tools generally have a load/unload station, a number of plating chambers, a number of cleaning chambers, and a transfer mechanism for moving the microelectronic workpieces between the various chambers and the load/unload station. The transfer mechanism can be a rotary system having one or more robots that rotate about a fixed location in the plating tool. One existing rotary transfer mechanism is shown in U.S. Pat. No. 6,136,163 issued to Cheung, et al., which is herein incorporated by reference in its entirety. Alternate transfer mechanisms include linear systems that have an elongated track and a plurality of individual robots that can move independently along the track. Each of the robots on a linear track can also include independently operable end-effectors. Existing linear track systems are shown in U.S. Pat. No. 5,571,325 issued to Ueyama, et al., PCT Publication No. WO 00/02808, and U.S. patent application Ser. Nos. 09/386,566; 09/386,590; 09/386,568; and 09/759,998, all of which are herein incorporated in their entirety by reference. Many rotary and linear transfer mechanisms have a plurality of individual robots that can each independently access most, if not all, of the processing stations within an individual tool to increase the flexibility and throughput of the plating tool.

The processing tools used in fabricating microelectronic devices must meet many performance criteria. For example, many processes must be able to form components that are much smaller than 0.5 µm, and even on the order of 0.1 µm. The throughput of these processing tools should also be as high as possible because they are typically expensive to purchase, operate and maintain. Moreover, microelectronic processing tools typically operate in clean rooms that are expensive to construct and maintain. The throughput, and thus the value of most processing tools, is evaluated by the number of wafers per hour per square foot (w/hr/ft$^2$) that the processing tool can produce with adequate quality. Therefore, plating tools and many other processing tools require fast, accurate transfer mechanisms and an efficient layout of processing chambers to accomplish acceptable throughputs.

One concern of existing processing apparatus is that the wafers may collide with one another as the transfer mechanism handles the wafers within a tool. Because many processing apparatus have a plurality of individual robots that move independently from each other to access many processing chambers within a single apparatus, the motion of the individual robots must be orchestrated so that the workpieces do not collide with each other or components of the tool. This typically requires complex algorithms in the software for controlling the motion of the workpieces, and the complexity of the software often necessitates significant processor capabilities and processing time. The complex algorithms accordingly increase the cost of the processing tools and reduce the throughput of workpieces. Additionally, errors in determining the position of the workpieces, executing the software, or calibrating the system can result in collisions between workpieces. Thus, it would be desirable to avoid collisions with workpieces in a manner that does not adversely impact other parameters of the processing apparatus.

Another concern of existing processing apparatus is that they tend to increase in size to handle larger workpieces. For example, as the industry moves from 200 mm. workpieces to 300 mm. workpieces, the tools required to handle the workpieces tend to become larger. As the tools become larger, they tend to occupy more clean room floor space which increases the cost of housing and supporting the tools.

Still another concern of existing processing apparatus is that the transfer mechanisms typically have complex mechanical and electrical assemblies with several components. This increases the risk that a component may malfunction, causing downtime of the entire processing machine and/or collisions that damage the workpieces. Therefore, it would be desirable to reduce the complexity of the transfer mechanisms.

Yet another aspect of existing transfer mechanisms is that they may not provide sufficient freedom of motion of the workpieces. Although many robots have been developed that have six degrees of freedom, many of these robots are not used in processing apparatus for fabricating microelectronic workpieces because the additional degrees of freedom increase the complexity of the systems. As a result, many existing transfer mechanisms limit one or more motions of the robots, such as limiting the vertical motion of the robots. It will be appreciated that it would be desirable to maintain the freedom of motion for the robots while also reducing the probability of collisions between the workpieces and the complexity of the robots.

SUMMARY

The present invention is directed toward transfer devices for handling microelectronic workpieces, apparatus for processing microelectronic workpieces, and methods for manufacturing and using such devices. Several embodiments of integrated tools comprise a single robot, dual end-effector transfer device that is expected to increase the flexibility of designing integrated tools. Such tools can include plating chambers configured to electrolytically or electrolessly apply conductive materials to the microelectronic workpieces. In other embodiments, the tools can include other processing stations that perform other processes on the microelectronic workpieces, and that are accessed by a single robot. By using a single robot, less space is needed within the cabinet for the robot. As a result, more space can be used for the processing chambers or stations so that larger processing chambers can be used in the same or very similar foot print as smaller chambers. This is useful as many device fabricators transition from using 200 mm wafers to 300 mm wafer because 300 mm tools can be used in approximately the same area as 200 mm tools, and the 300 mm tools can have the same number of processing chambers as the 200 mm tools. Thus, several embodiments of single robots with dual end-effectors in accordance with the invention allow designers to more easily replace 200 mm tools with 300 mm tools. In several further embodiments, the dual end-effectors can have a common axis of rotation, which can further reduce the space occupied by the robot and required by the robot for movement.

Another feature is that each of the end-effectors of the single robot can service processing chambers in either row inside tool. The integrated tools can accordingly have several different configurations of processing chambers that can be assembled on a "custom basis." The processing chambers can have a common configuration so that different types of processing chambers can be mounted to the tool within the cabinet. By providing a robot with two end-effectors that have a significant range of motion, each end-effector can access any of the processing chambers so that the configuration of the processing chambers in the tool is not limited by the motion of the robot and/or the end-effectors. Therefore, the processing chambers can be arranged in a configuration that affords an efficient movement of workpieces through the tool to enhance the throughput.

The throughput of finished workpieces is also expected to be enhanced because the workpieces cannot collide with each other or another robot in the tool when a single robot with dual end-effectors is used. The robot can accordingly be a high-speed device that moves quickly to reduce the time that each workpiece rests on an end-effector. Additionally, the robot can move quickly because it does not need complex collision-avoidance software that takes time to process and is subject to errors. The single robot can accordingly service the processing stations as quickly as a dual robot system with single end-effectors on each robot. In several embodiments of the invention, therefore, the combination of having a fast, versatile robot and a flexible, efficient arrangement of processing stations provides a high throughput (w/hr/ft$^2$) of finished workpieces.

In an aspect of one embodiment, a transfer device can include a transport unit configured to move along a linear track and an arm assembly operatively coupled to the transport unit. For example, the transfer device can further include a lift assembly carried by the transport unit, and the arm assembly can be coupled to the lift assembly. The arm assembly can include an arm actuator carried by the lift assembly to move along a lift path and an arm carried by the arm actuator to rotate about the lift path. The arm can include an extension projecting from one side of the lift path. The arm actuator can rotate the arm about the lift path to position the first and second extensions relative to processing stations of an apparatus. The transfer device can also include a first end-effector and a second end-effector, each being rotatably coupled to the extension of the arm to rotate independently of each other.

In another aspect of certain embodiments, the first end-effector is spaced above the arm by a first distance, and the second end-effector is spaced above the arm by a second distance. The first distance is different than the second distance to space the first end-effector at a different elevation than the second end-effector. The different spacing of the first and second end-effectors relative to the arm allows the device to carry two workpieces in a superimposed relationship without the potential of a collision between the workpieces. The first end-effector can be driven by an inner shaft and the second end-effector can be driven by an outer shaft disposed coaxially outwardly from the inner shaft so that the rotational motion of the first end-effector can be independent of the rotational motion of the second end-effector, though both end-effectors can rotate about a common axis. Several additional embodiments and alternate embodiments of devices, systems and methods are also included in the invention.

DETAILED DESCRIPTION

The following description discloses the details and features of several embodiments of transfer devices for handling microelectronic workpieces, processing apparatus for processing microelectronic workpieces, and methods for making and using such devices. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 1–8.

The operation and features of the transfer devices for handling microelectronic workpieces are best understood in light of the environment and equipment in which they can be used. As such, several embodiments of processing apparatus in which the transfer devices can be used will be described with reference to FIG. 1. The details and features of several embodiments of transfer devices will then be described with reference to FIGS. 2–8.

Figure 1:
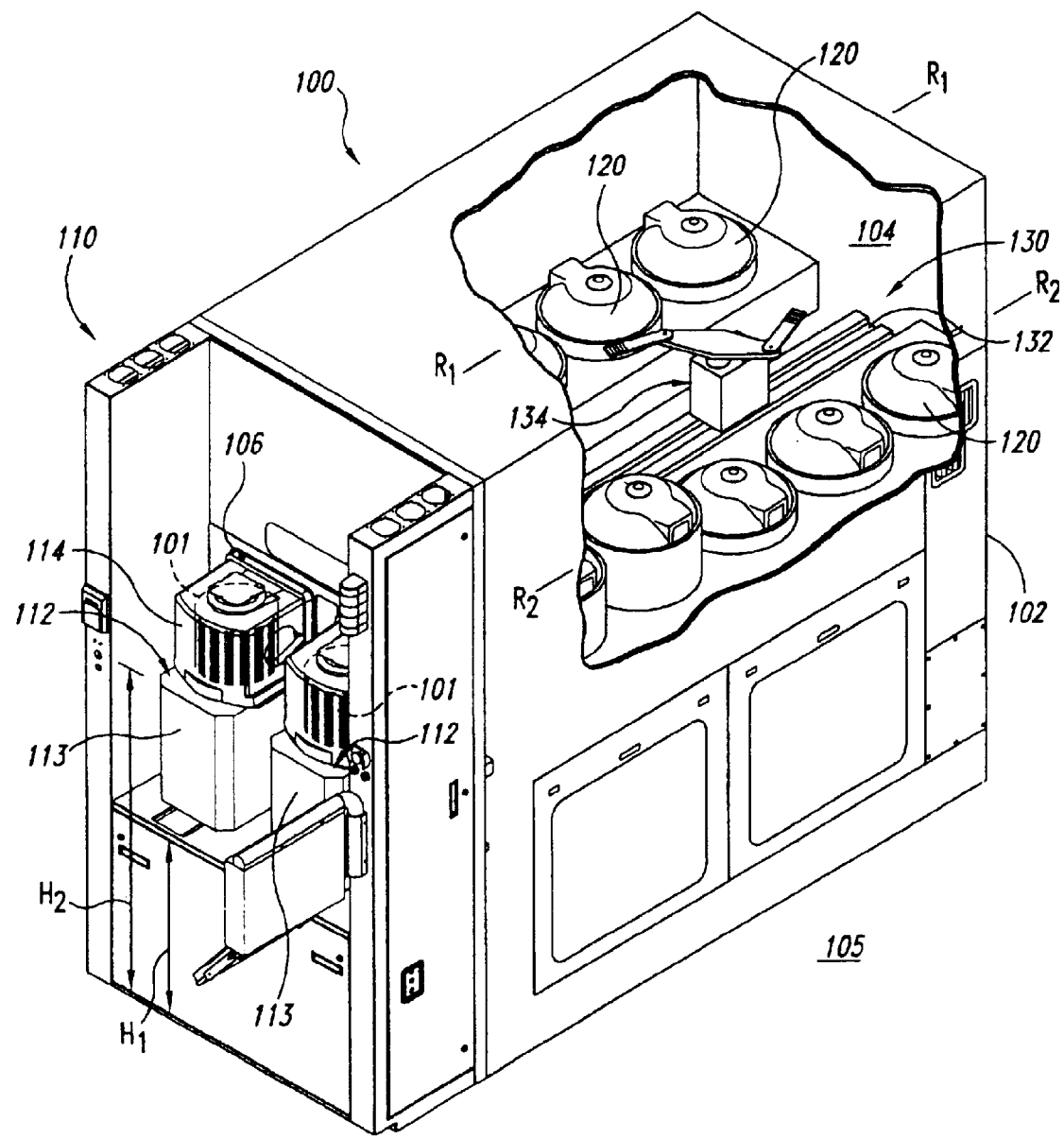
FIG. 1 is an isometric view of a processing apparatus for processing microelectronic workpieces including a transfer device for handling the workpieces in accordance with an embodiment of the invention. A portion of the processing apparatus is shown in a cut-away illustration.

A. Selected Embodiments of Microelectronic Workpiece Processing Apparatus for Use with Automatic Workpiece Transfer Devices FIG. 1 is an isometric view of a processing apparatus 100 having a workpiece handling device 130 in accordance with an embodiment of the invention for manipulating a plurality of microelectronic workpieces 101. A portion of the processing apparatus 100 is shown in a cut-away view to illustrate selected internal components. In one aspect of this embodiment, the processing apparatus 100 can include a cabinet 102 having an interior region 104 defining an enclosure that is at least partially isolated from an exterior region 105. The cabinet 102 can also include a plurality of apertures 106 through which the workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing apparatus 100 can also include a plurality of processing stations 120 and a transfer device 130 in the interior region 104 of the cabinet 102. The processing apparatus, for example, can be a plating tool, and the processing stations 120 can be single-wafer chambers for electroplating, electroless plating, annealing, cleaning, etching, and/or metrology analysis. Suitable processing stations 120 for use in the processing apparatus 100 are disclosed in U.S. Pat. Nos. 6,228,232 and 6,080,691, and in U.S. application Ser. Nos. 09/385,784; 09/386,803; 09/386,610; 09/386,197; 09/501,002; 09/733,608; 09/804,696; and 09/804,697, all of which are herein incorporated in their entirety by reference. The processing stations 120 are not limited to plating devices, and thus the processing apparatus 100 can be another type of tool. For example, in one embodiment, the processing stations 120 are configured to apply a photoresist material to the microelectronic workpieces 101.

The transfer device 130 moves the microelectronic workpieces 101 between the workpiece containers 114 and the processing stations 120. The transfer device 130 includes a linear track 132 extending in a lengthwise direction of the interior region 104 between the processing stations 120. In the particular embodiment shown in FIG. 1, a first set of processing stations 120 is arranged along a first row $R_1$—$R_1$ and a second set of processing stations 120 is arranged along a second row $R_2$—$R_2$. The linear track 130 extends between the first and second rows of processing stations 120. The transfer device 130 can further include a robot unit 134 carried by the track 132. As explained in more detail below, the combination of the linear transfer device 130 and the arrangement of the processing stations 120 provides a good throughput rate of microelectronic workpieces and inhibits collisions between workpieces that are carried by the robot unit 134.

Figure 2A:
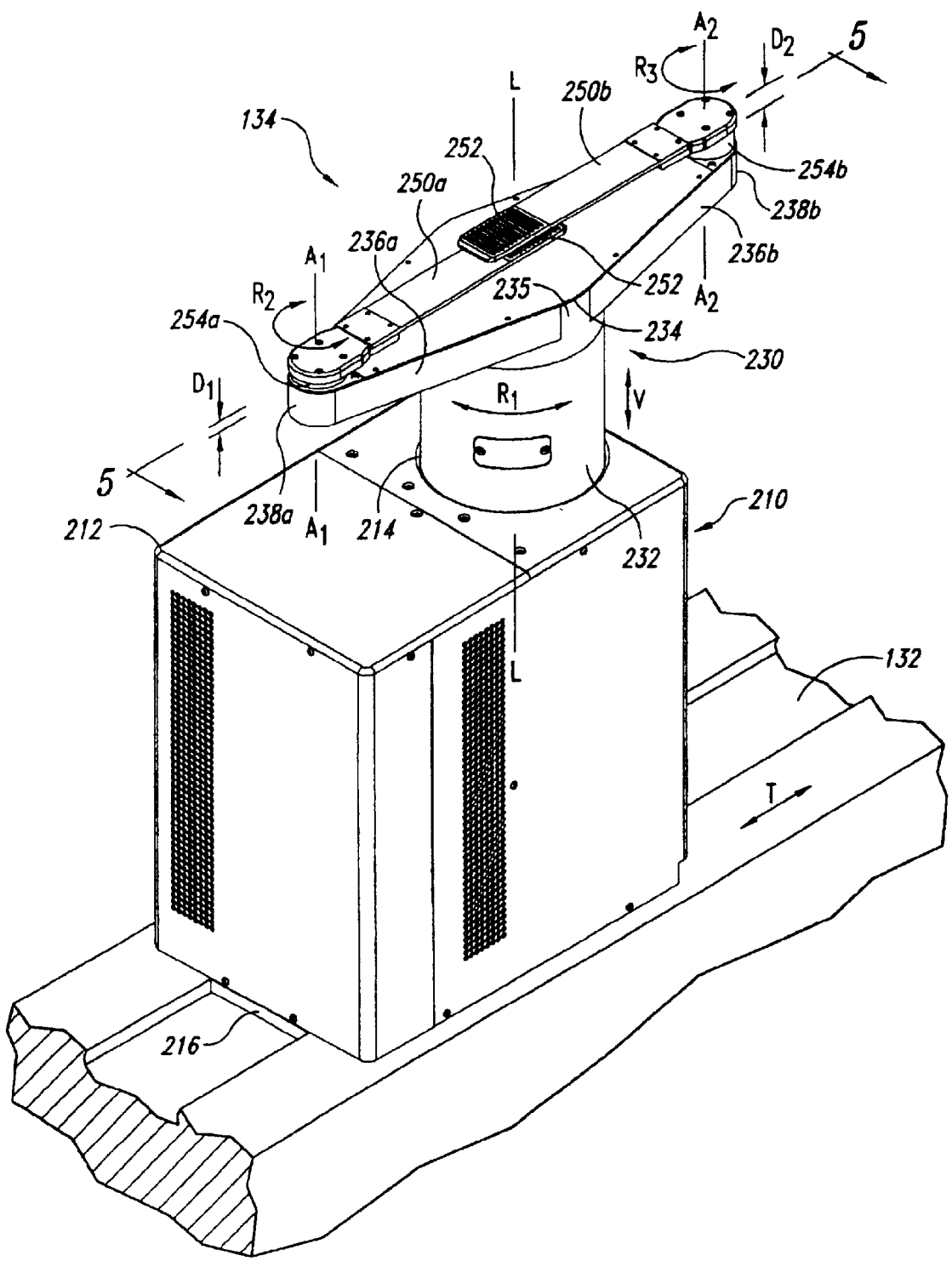
FIGS. 2A and 2B are isometric views of transfer devices for handling microelectronic workpieces in accordance with embodiments of the invention.

B. Embodiments of Transfer Devices for Handling Microelectronic Workpieces in Processing Machines FIG. 2A illustrates an embodiment of the robot unit 134 in greater detail. The robot unit 134 can include a transport unit 210, an arm assembly 230 carried by the transport unit 210, and first and second end-effectors 250 (identified individually by reference numbers 250a and 250b) carried by the arm assembly 230. The transport unit 210 can include a shroud or housing 212 having a plurality of panels attached to an internal frame (not shown in FIG. 2A). An opening 214 in a top panel of the housing 212 receives a portion of the arm assembly 230. It will be appreciated that the transport unit 210 and the housing 212 can have many different configurations depending upon the particular environment in which the robot unit 134 is used. The transport unit 210, for example, can be a base that can be stationary, rotary, or move in a non-linear manner. The transport unit 210 can also include a guide member configured to move laterally along the track 132. The particular embodiment of the transport unit 210 shown in FIG. 2A includes a guide member defined by a base plate 216 that slidably couples the robot unit 134 to the track 132. The robot unit 134 can accordingly translate along the track 132 (arrow T) to position the robot unit 134 adjacent to a desired processing station 120 (FIG. 1).

The arm assembly 230 can include a waist member 232 that is coupled to a lift assembly (not shown in FIG. 2A). The arm assembly 230 can also include an arm 234 having a medial section 235, a first extension 236a projecting from one side of the medial section 235, and a second extension 236b extending from another side of the medial section 235. The first and second extensions 236a–b of the arm 234 can be diametrically opposed to one another as shown in FIG. 2A, or they can extend at a desired angle to each other. In one embodiment, the first and second extensions 236a and 236b are integral with one another, but in alternate embodiments the first and second extensions 236a and 236b can be individual components that are fixed to each other. In still further embodiments, the arm 234 can include a single extension, as described in greater detail below with reference to FIGS. 2B, 7 and 8.

The arm assembly 230 can move along a lift path L—L to change the elevation of the arm 234 for positioning the end-effectors 250 at desired elevations. The lift path L—L generally extends transverse to the track 132, which as used herein includes any oblique or perpendicular arrangement.

The arm assembly 230 can also rotate (arrow $R_1$) about the lift path L—L to position a distal end 238a of the first extension 236a and/or a distal end 238b of the second extension 236b proximate to a desired workpiece container 114 or processing station 120. The first and second extensions 236a–b generally rotate about the lift path L—L as a single unit because they are integral or fixed with each other. The motion of the first and second extensions 236a–b are accordingly dependent upon each other in this embodiment. In alternate embodiments, the arm 234 can have extensions that are not fixed to each other and can move independently from each other. Selected embodiments of lift assemblies for moving the arm assembly 230 along the lift path L—L and other assemblies for rotating the arm 234 about the lift path are described in more detail below with reference to FIGS. 4 and 5.

The end-effectors 250 are rotatably carried by the arm 234. In one embodiment, the first end-effector 250a is rotatably coupled to the first distal end 238a to rotate about a first rotation axis $A_1$—$A_1$ (arrow $R_2$). The second end-effector 250b can be rotatably coupled to the second distal end 238b of the arm 234 to rotate about a second rotation axis $A_2$—$A_2$ (arrow $R_3$). The first and second rotation axes $A_1$—$A_1$ and $A_2$—$A_2$ can extend generally parallel to the lift path L—L, but in alternate embodiments these axes can extend transverse to the lift path L—L. The end-effectors 250a–b can each include a workpiece holder 252 for holding the workpieces 101 to the end-effectors 250. The workpiece holders 252 shown in FIG. 2A are vacuum chucks that hold the workpieces 101 to the end-effectors 250 using suction. Alternate embodiments of workpiece holders 252 can include edge-grip end-effectors, such as those disclosed in the foregoing patent applications that have been incorporated by reference. As explained in more detail below with reference to FIGS. 3A–3C, the rotational motion of (a) the arm 234 about the lift path L—L, (b) the first end-effector 250a about the first rotation axis $A_1$—$A_1$, and (c) the second end-effector 250b about the second rotation axis $A_2$—$A_2$ can be coordinated so that the first and second end-effectors 250a and 250b can each be positioned adjacent to any of the workpiece containers 114 and processing stations 120 on either side of the cabinet 102 (FIG. 1).

The first end-effector 250a can be spaced apart from the arm 234 by a first distance $D_1$, and the second end-effector 250b can be spaced apart from the arm 234 by a second distance $D_2$. In the embodiment shown in FIG. 2A, the distance $D_1$ is less than the distance $D_2$ such that the first end-effector 250a is at a different elevation than the second end-effector 250b. The first end-effector 250a accordingly moves through a first plane as it rotates about the first rotation axis $A_1$—$A_1$, and the second end-effector 250b moves through a second plane as it rotates about the second rotation axis $A_2$—$A_2$. The first and second planes are generally parallel and fixedly spaced apart from each other so that the end-effectors 250a–b cannot interfere with each other. The first and second planes, however, can have other arrangements (i.e., nonparallel) so long as they do not intersect in a region over the arm 234. The first and second end-effectors 250a and 250b can be fixed at the particular elevations relative to the arm 234 using spacers or other types of devices. For example, the first end-effector 250a can be spaced apart from the arm 234 by a first spacer 254a, and the second end-effector 250b can be spaced apart from the arm 234 by a second spacer 254b. The first and second spacers 254a–b can have different thicknesses to space the end-effectors 250 apart from the arm 234 by the desired distances.

Figure 2B:
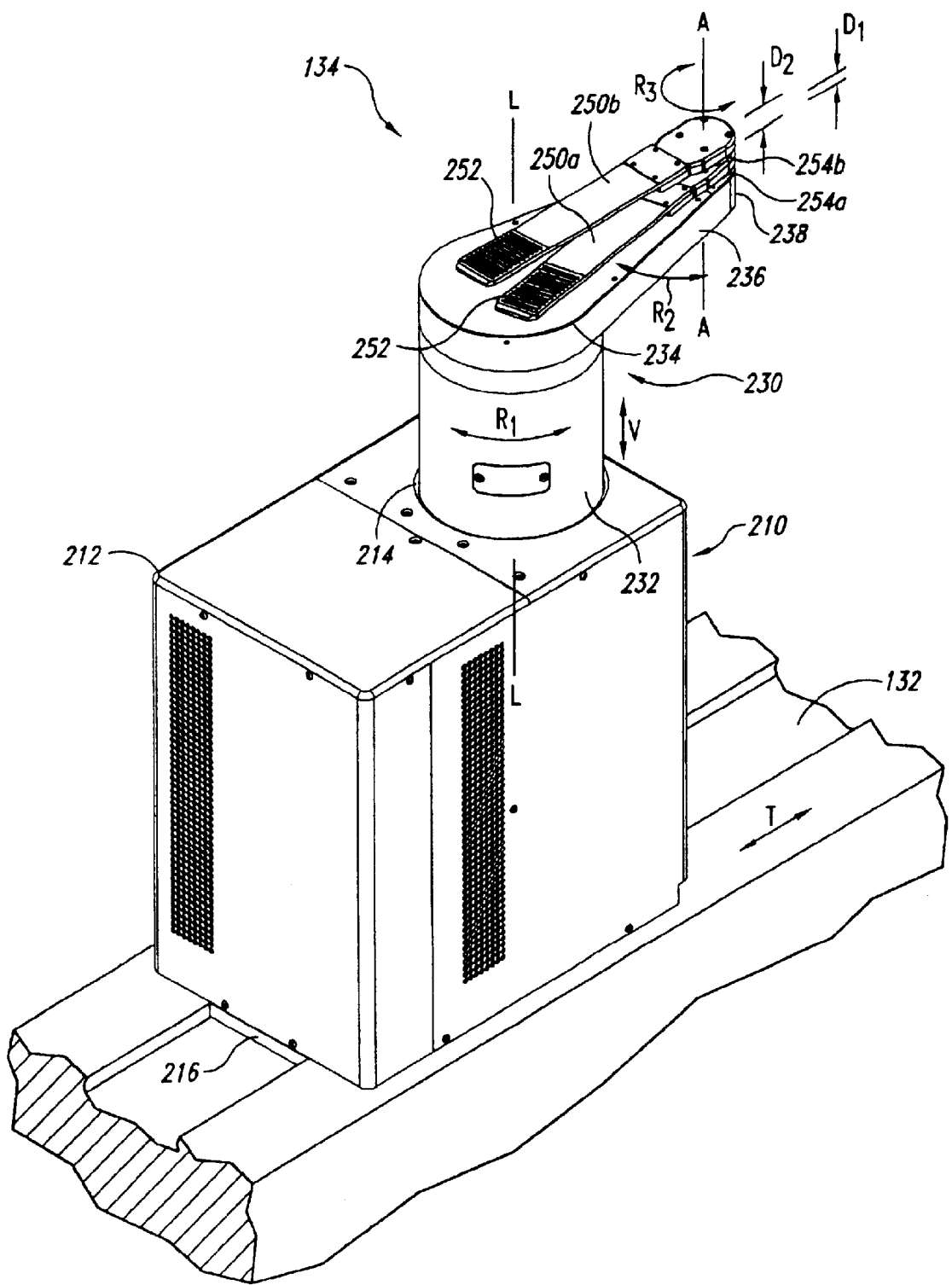

The first and second end-effectors 250a–b and the arm 234 can have different configurations than the configuration shown in FIG. 2A. For example, as shown in FIG. 2B, the arm 234 can have only a single extension 236 projecting from the waist member 232 and both of the end-effectors 250a–b can be carried by the "single-extension" arm such that the first and second end-effectors 250a–b are fixed at different elevations relative to the arm 234. The end-effectors 250a–b, for example, can be coupled to the end 238 of the arm and rotate about a common rotation axis A—A. Further details of another arm having a single-extension are described below with reference to FIGS. 7 and 8.

Figure 3A:
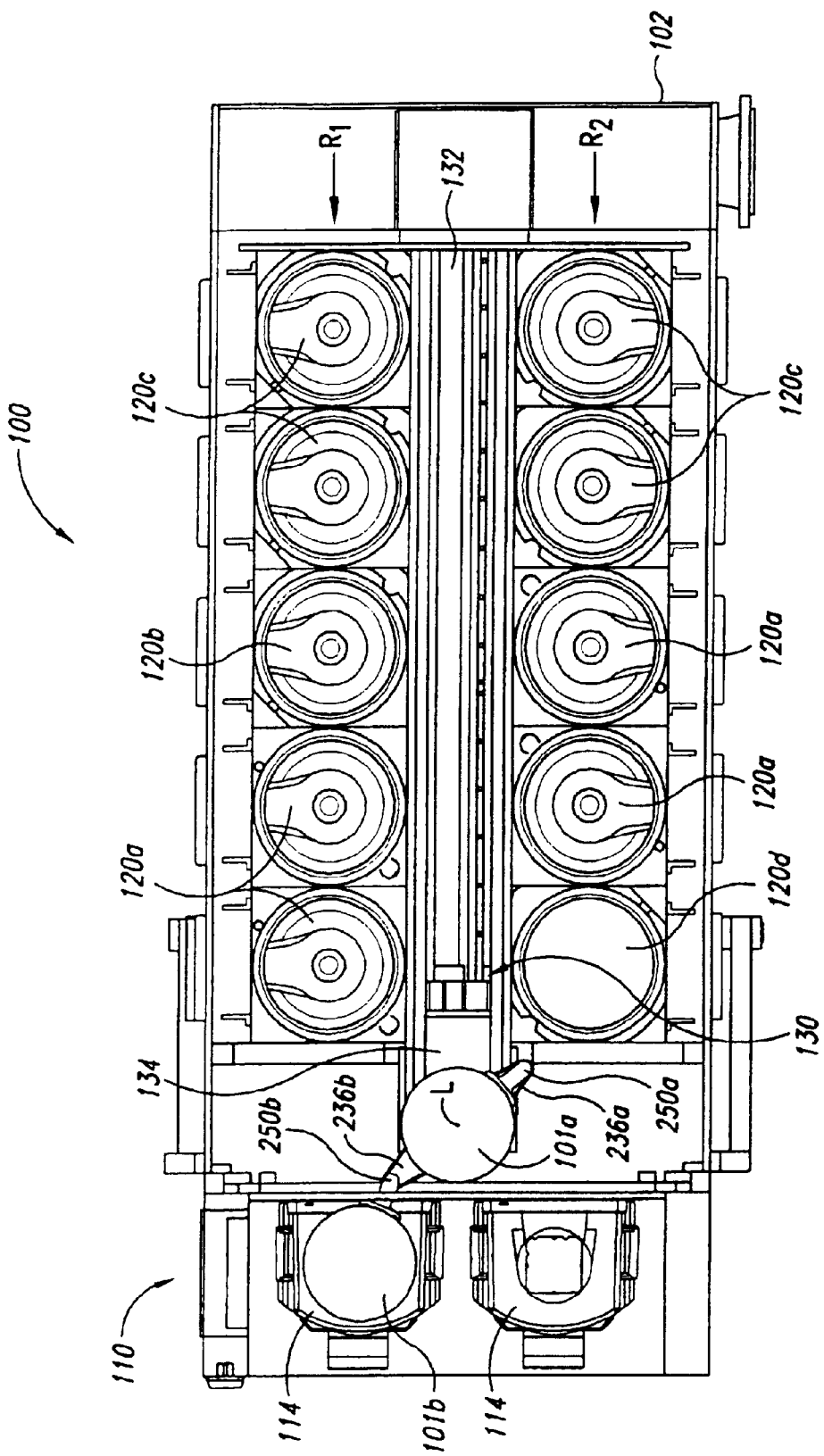
FIG. 3A is a top plan view of a processing apparatus for processing microelectronic workpieces showing one configuration for operating a transfer device in accordance with an embodiment of the invention.
Figure 3B:
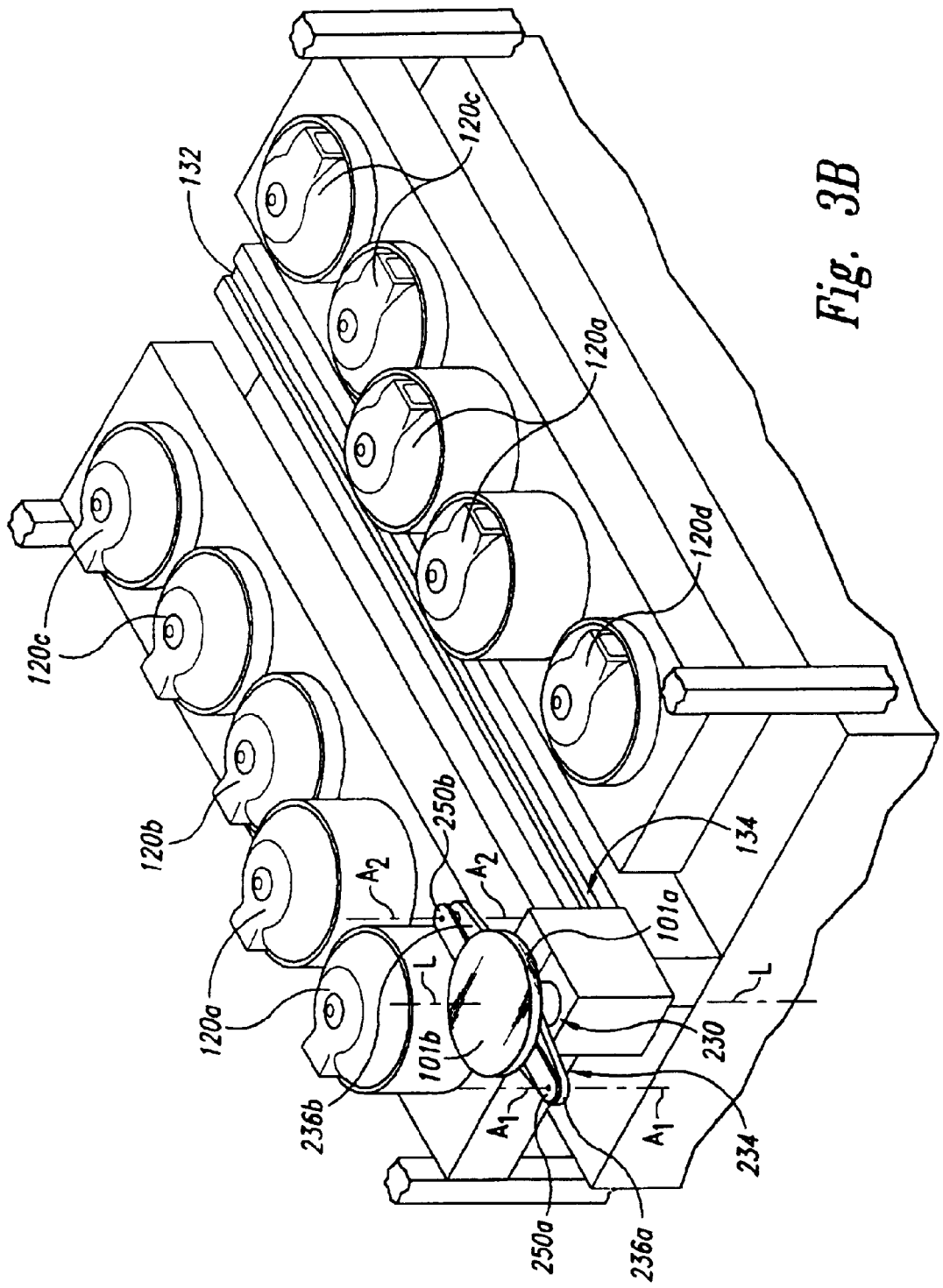
FIG. 3B is a partial isometric view of the transfer device of FIG. 3A showing another configuration for operating the transfer device.
Figure 3C:
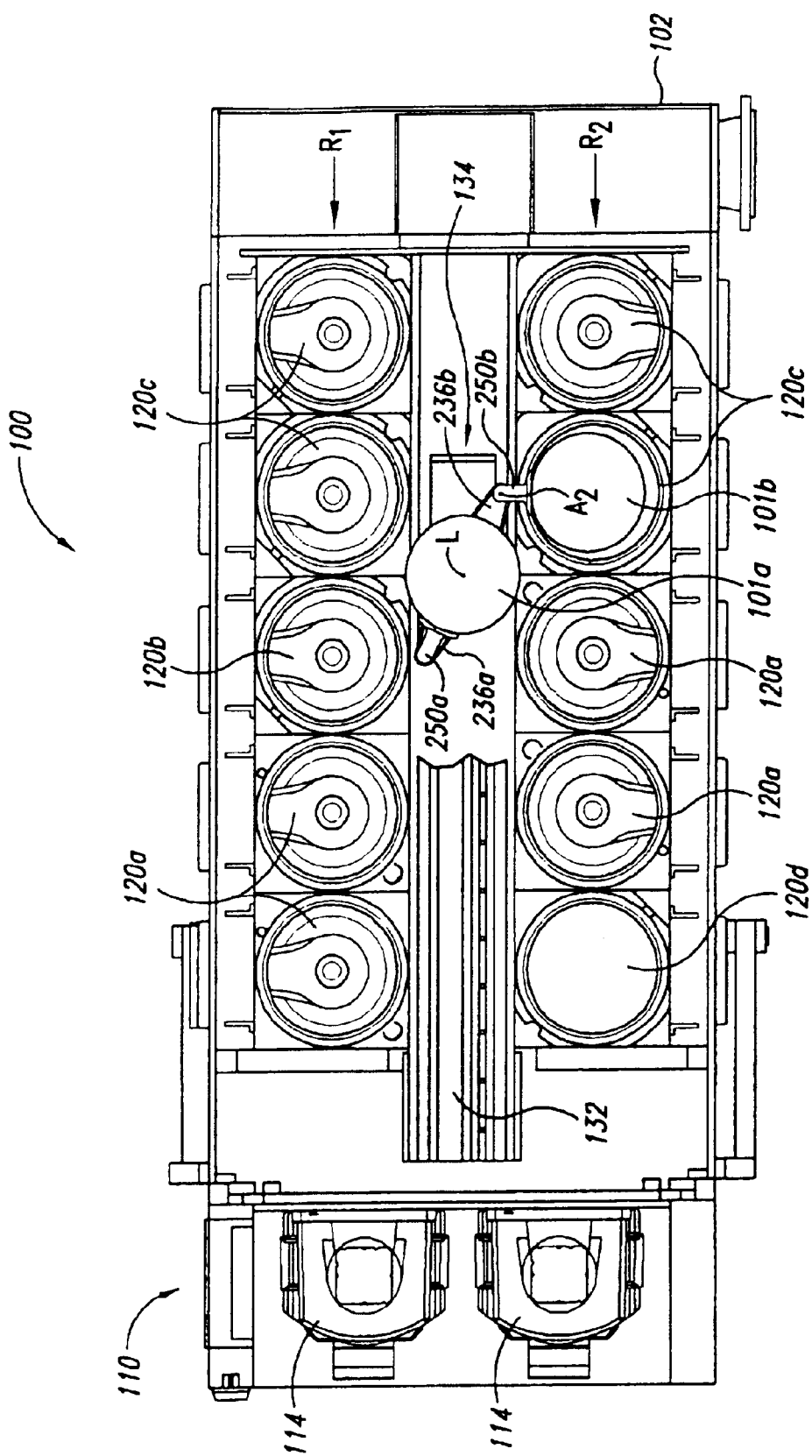
FIG. 3C is a top plan view of the transfer device of FIGS. 3A and 3B showing another configuration for operating the transfer device.

FIGS. 3A–3C illustrate an arrangement of processing stations 120 and several configurations of operating the transfer device 130 in greater detail. The processing stations 120 can include any combination or single type of single-wafer units including (a) clean/etch capsules 120a, such as the CAPSULE™ manufactured by Semitool, Inc.; (b) electroless plating chambers 120b; (c) electroplating chambers 120c; (d) Rapid Thermal Annealing (RTA) chambers 120d; (e) metrology stations (not shown in FIG. 3A); and/or other types of single-wafer processing stations. In the particular embodiment shown in FIG. 3A, the first row $R_1$ of processing stations 120 includes a plurality of clean/etch capsules 120a proximate to the load/unload station 110, an electroless plating chamber 120b downstream from the clean/etch capsules 120a, and a plurality of electroplating chambers 120c downstream from the electroless plating chamber 120b. The second row $R_2$ of processing stations of this particular embodiment has a similar arrangement, except that an RTA chamber 120d is at the output side of the load/unload station 110 and there is not an electroless chamber between the clean/etch capsule 120a and the electroplating chambers 120c.

The arrangement of processing stations illustrated in FIG. 3A represents only one example of how the processing stations 120 can be arranged within the cabinet 102. In alternate embodiments a metrology station can be substituted for one or more of the other processing stations, the position of the processing stations relative to the load/unload station 110 can be changed, and/or other types of processing stations can be used such that some of the processing stations illustrated in FIG. 3A may not be included in the processing apparatus 100. For example, the position of the clean/etch capsules 120a and the electroplating chambers 120c can be switched, or additional electroplating chambers 120c can be substituted for the electroless chamber 120b and the RTA chamber 120d.

FIG. 3A illustrates one configuration of operating the transfer device 130 after a first workpiece 101a has been loaded onto the first end-effector 250a. The operation of the first end-effector 250a can be similar to that of the second end-effector 250b, and thus only the movement of the second end-effector 250b will be described below for purposes of brevity. The robot unit 134 can move the arm assembly 230 (FIG. 2A) so that the second end-effector 250b can pick up a second workpiece 101b from a workpiece container 114. To do this the robot unit 134 positions the first workpiece 101a in a transport position over the lift path L—L, and then the arm assembly 230 (FIG. 2A) moves vertically until the second end-effector 250b is at a desired height to pass underneath the second workpiece 101b. The arm assembly 230 then rotates the second extension 236b about the lift path L—L (FIG. 2A) and/or the second end-effector 250b rotates about the second rotation axis $A_2$—$A_2$ (FIG. 2A) until the second end-effector 250b is under the second workpiece 101b. The arm assembly 230 can then be raised as a vacuum is drawn through the workpiece holder 252 (FIG. 2A) to securely hold the second workpiece 101b to the second end-effector 250b. The robot unit 134 then extracts the second workpiece 101b from the workpiece container 114 by a combination of movements of the robot unit 134 along the track 132, rotation of the second extension 236b about the lift path L—L, and/or rotation of the second end-effector 250b about the second rotation axis $A_2$—$A_2$. The remaining workpieces in the container 114 can be loaded onto the end-effectors 250 in subsequent processing in a similar manner by further adjusting the height of either the workpiece container 114 and/or the arm assembly 230 (FIG. 2A) or they can be unloaded into the other container 114 by reversing this procedure. In general, it is more desirable to move the arm assembly to the correct height than it is to move the workpiece container 114 because this eliminates the need to precisely index all of the workpieces each time. After picking up the workpieces 101, the transfer device 130 can load or unload any of the workpieces 101 carried by the robot unit 134 in any of the processing stations 120 in either the first row $R_1$ or the second row $R_2$.

The flow of the workpieces through the processing stations 120 varies according to the particular application and use of the processing apparatus 100. In one embodiment, the transfer device 130 can restrict one of the end-effectors to handle only clean workpieces and the other end-effector to handle only dirty workpieces. The clean end-effector can be used to handle the workpieces in the workpiece containers and to remove the workpieces from the clean/etch capsules 120a. The dirty end-effector can be used to remove workpieces from the plating chambers 120b and 120c and then input the dirty workpieces into the clean/etch capsules 120a.

One particular process flow for plating copper or other materials onto the second workpiece 110b involves placing the second workpiece 101b in either (a) the electroless plating chamber 120b if the seed layer needs to be enhanced or (b) one of the electroplating chambers 120c. After the workpiece 101b has been plated, the transfer device 130 extracts the workpiece 101b from the corresponding electroplating chamber 120c and typically places it in a clean/etch chamber 120a. The second workpiece 101b can then be withdrawn from the clean/etch capsule 120a and placed in the other workpiece container 114 for finished workpieces (the "out-WIP"). It will be appreciated that this process flow is merely one example of potential process flows, and that the movement of the workpieces through the processing stations 120 varies according to the particular configuration of the processing apparatus and the processes being performed on the workpieces. For example, the workpiece 101b can be transferred to the annealing chamber 120d after the clean/etch chamber 120a before it is placed in the out-WIP.

FIG. 3B illustrates another configuration of operating the transfer device 130 in which the workpieces 101a–b are positioned for being moved along the track 130. The second workpiece 101b is superimposed over the first workpiece 101a by rotating the first end-effector 250a about the first rotation axis $A_1$—$A_1$ and rotating the second end-effector 250b about the second rotation axis $A_2$—$A_2$ until both end-effectors are over the arm. The arm 234 also rotates about the lift path L—L so that the arm 234 and the first and second extensions 236a and 236b extend generally in the direction of the track 132. The robot unit 134 can then translate along the track 132 between the processing stations 120.

The configuration illustrated in FIG. 3B is particularly useful in 300 mm applications to reduce the overall width of the processing apparatus 100. It is desirable to minimize the area of the floor space occupied by each processing apparatus, but many designs for accommodating 300 mm wafers tend to occupy much larger areas than those for use with 200 mm wafers because the processing stations and the area between the processing stations must be able to accommodate the larger wafers. By superimposing the workpieces over one another for transport along the track 132, the open area used for transporting the workpieces between the rows of processing stations can be reduced to approximately the diameter of a single workpiece. Additionally, the same configuration can be used for handling 200 mm wafers such that the area of floor space occupied by a 300 mm tool is not significantly more, if any, than a 200 mm tool. After the workpieces 101a–b are superimposed for movement along the track 132, the robot unit 134 can move along the track to a desired processing station and the arm assembly 230 can move vertically along the lift path L—L to position the workpieces at desired elevations.

FIG. 3C illustrates another configuration of operating the transfer device 130 in which the robot unit 134 is loading the second workpiece 101b into one of the electroplating chambers 120c. The robot unit 134 slides along the track 132 until the second extension 236b of the arm 234 (FIG. 3B) is proximate to the desired electroplating station 120c. The arm 234 then rotates about the lift path L—L and the second end-effector 250b rotates about the second rotation axis $A_2$—$A_2$ until the second workpiece 101b is positioned over an inverted head of the electroplating station 120c. The robot unit 134 can accordingly position each of the end-effectors 250a and 250b on the desired side of the cabinet 102 and at a desired height so that the end-effectors 250a and 250b can each access any of the processing stations 120 in either the first row $R_1$ or the second row $R_2$. The transfer device 130 accordingly provides a single-robot having a single arm and dual end-effectors that can service any of the workpiece containers 114 and/or processing modules 120 within the cabinet 102.

Several embodiments of the transfer device 130 are expected to prevent collisions with the workpieces 101 without complex software algorithms or complex mechanical systems. An aspect of these embodiments of the transfer device 130 is that they have only a single arm and the end-effectors are coupled to the single arm so that the first end-effector operates in a first plane and the second end-effector operates in a second plane that does not intersect the first plane over the arm. The first and second end-effectors can be mechanically spaced apart from each other to operate in different planes by rotatable spacers that space the first and second end-effectors apart from the arm by first and second distances, respectively, irrespective of the elevation of the arm itself. The end-effectors are thus arranged so that they can rotate freely relative to the arm but the workpieces cannot collide with each other. Therefore, the embodiments of the transfer device 130 that have a single arm with end-effectors coupled to the arm at different elevations are expected to mitigate collisions between the workpieces.

Several embodiments of the transfer device 130 are also versatile and can be used in many different tools because the end-effectors have a significant freedom of movement. An aspect of an embodiment of the transfer device 130 is that the arm can (a) translate along a track through the machine, (b) move transversely to the track along a lift path to change the elevation of the end-effector s, and (c) rotate about the lift-path. This allows the arm to position the end-effectors at a number of locations and elevations within the tool so that the tool can have several different types and arrangements of processing stations serviced by a single robot. Another aspect is that the end-effectors can be located at opposite ends of the arm, and they can independently rotate about the arm. This allows each end-effector to service any of the processing stations within the tool. Thus, several embodiments of the transfer device 130 provide the benefits of having two independently operable end-effectors in a single robot unit without the complex mechanical components and software required for systems with two separate robot units.

Many of the embodiments of the transfer device 130 also provide a high throughput of finished wafers. The throughput of a machine used to fabricate microelectronic devices is typically measured by the w/hr/ft$^2$ processed through the machine. One aspect of providing a high throughput is that the linear track allows several processing stations to be arranged in rows which are serviced by a single robot. The linear arrangement of processing stations and the linear-track transfer device significantly decrease the floor space required for each processing station compared to systems that use a rotary robot system. Moreover, by transferring the workpieces along the track in a superimposed arrangement, the distance between the rows of processing stations can be reduced to approximately a single wafer diameter. This is particularly useful in 300 mm applications because carrying these workpieces side-by-side along a track would require a significant increase in the foot print of the processing tool. Another aspect of providing a high throughput is that the single-arm, dual end-effector robot can operate quickly to access all, or at least most, of the processing stations in the tool because (a) it does not need to have complex collision avoidance algorithms that slow down processing time, and (b) it can use high-speed motors for a high operating speed. The combination of maintaining a fast, versatile robot unit and an arrangement that provides an efficient foot print accordingly provides a high throughput (w/hr/ft$^2$) for several embodiments of the processing apparatus 100.

Figure 4:
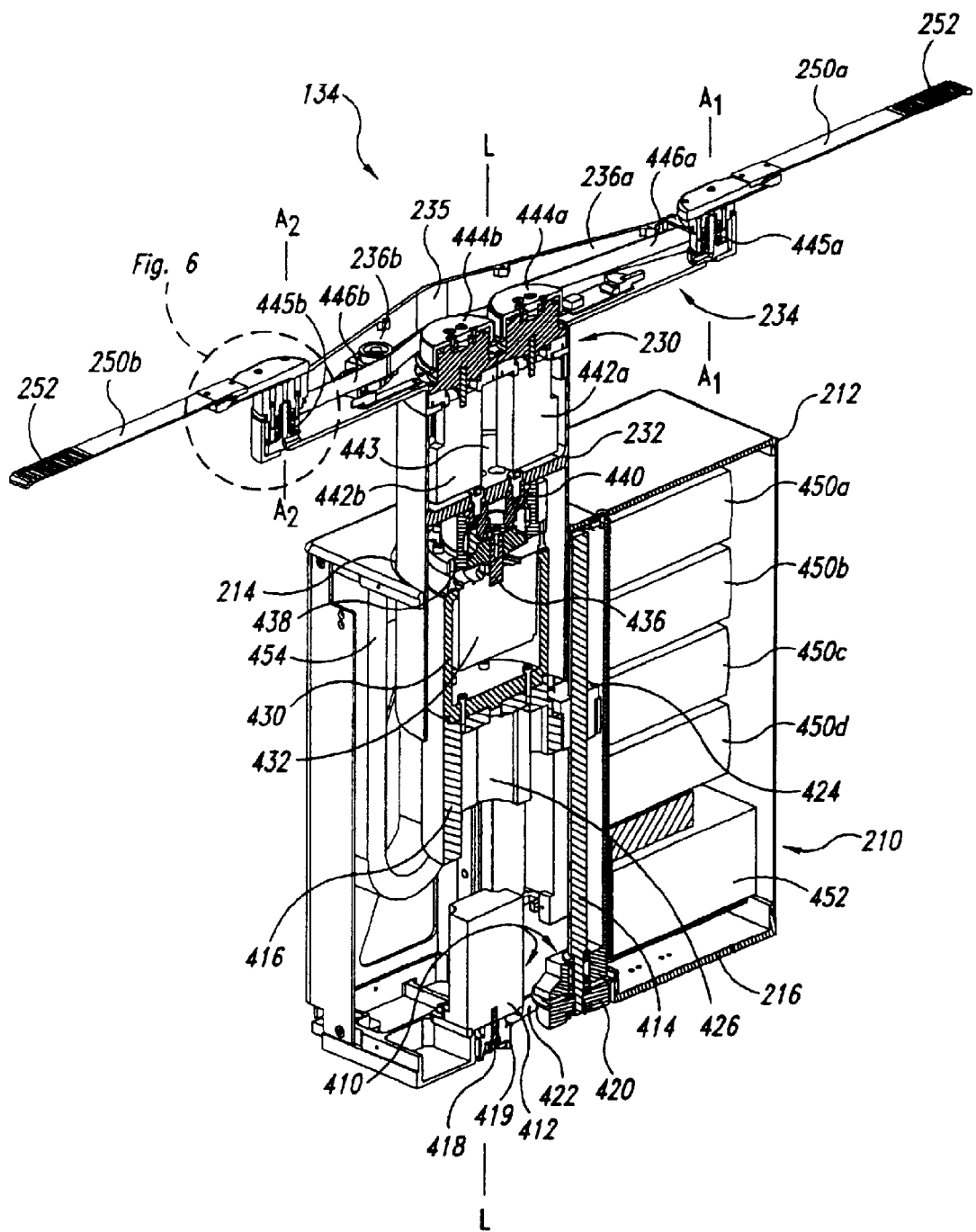
FIG. 4 is an isometric view of a transfer device for handling microelectronic workpieces in accordance with an embodiment of the invention in which selected components are shown in cross section and other components are shown schematically.

FIG. 4 illustrates one embodiment of the robot unit 134 in greater detail. In this particular embodiment, the transport unit 210 and the arm assembly 230 can operate in a manner similar to that described above with reference to FIGS. 1–3C, and thus like reference numbers refer to like components in FIGS. 1–4. The robot unit 134 can include a lift assembly 410 having a lift actuator 412, a lift member 414, and a lift platform 416 coupled to the lift member 414. The lift actuator 412 can be a servomotor, a linear actuator, or another suitable device that can provide precise control of rotational or linear motion. In the embodiment shown in FIG. 4, lift actuator 412 is a servomotor having a driveshaft 418 to which a drive pulley 419 is attached. The lift member 414 in this embodiment is a ball screw or a lead screw having a lower end securely connected to a passive pulley 420. The lift assembly 410 can also include a guide, such as a guide rail 414a. The output from the lift actuator 412 is coupled to the passive pulley 420 by a belt 422 around the drive pulley 419 and the passive pulley 420. The lift assembly 410 can further include a nut 424 that is threadedly coupled to the lead-screw lift member 414 and fixedly coupled to the lift platform 416.

The lift assembly 410 operates to raise/lower the lift platform 416 by energizing the lift actuator 412 to rotate the drive pulley 419 and produce a corresponding rotation of the lead-screw lift member 414. The nut 424 moves vertically according to the rotation of the lift member 414 to raise/lower the lift platform 416 for adjusting the elevation of the first and second end-effectors 250a and 250b. It will be appreciated that the stroke length of the nut 424 defines the extent of the lift motion of the arm assembly 230.

Additionally, when the nut 424 is positioned at the lower end of the lift member 414, the lift actuator 412 is received in a cavity 426 in the lift platform 416. The cavity 426 allows the size of the robot unit 134 to be relatively compact and the length of the lift stroke to be relatively large because the lift actuator 412 can be positioned directly under the lift platform 416.

It will be appreciated that other embodiments of lift assemblies can be used to raise and lower the arm assembly 230. For example, the lift member can be a scissor lift assembly driven by a servomotor, or the driveshaft of the lift actuator 412 can be the lead-screw lift member 414 to eliminate the pulleys and belts of the embodiment of FIG. 4.

The arm assembly 230 is carried by the lift assembly 410 to move along the lift path L—L. In the embodiment shown in FIG. 4, the arm assembly 230 includes a base 430 carried by the lift platform 416 and a waist motor 432 carried by the base 430. The waist member 232 is coupled to an output shaft 436 of the waist motor 432 by a boss 437. The waist motor 432 is fixedly attached to the base 430, and a rim 438 is fixedly attached to the base 430 to generally enclose the boss 437. The waist member 232 is fixedly attached to the boss 437 such that rotation of the boss 437 rotates the waist member 232. A bearing 440 between the boss 437 and the rim 438 allows the waist motor 432 to rotate the boss 437 and the waist member 232 via the output of the driveshaft 436.

The arm assembly 230 can further include a first effector-drive 442a and a second effector-drive 442b carried in a cavity 443 of the waist member 232. The first effector-drive 442a has an output shaft coupled to a drive pulley 444a, which is coupled to a passive pulley 445a by a belt 446a. The second effector-drive 442b can be operatively coupled to the second end-effector 250b by a similar arrangement. The second effector-drive 442b, for example, can have an output shaft connected to a drive pulley 444b, which is coupled to a passive pulley 445b by a belt 446b. In the embodiment shown in FIG. 4, the first and second effector-drives 442a and 442b are servomotors. Alternate embodiments of the arm assembly 230, however, can use linear actuators housed in the arm 234 or other types of actuators to manipulate the end-effectors 250a and 250b. For example, the effector-drives 442 can be servomotors that have output shafts with a worm gear, and the passive pulleys 445 could be replaced with gears that mesh with the worm gears. The rotation of the worm gears would accordingly rotate the end-effectors about the rotation axes.

The arm assembly 230 operates by (a) rotating the waist member 232 and the arm 234 about the lift path L—L, and (b) independently rotating the first and second end-effectors 250a and 250b about the first and second rotation axes $A_1$—$A_1$ and $A_2$—$A_2$, respectively. The waist motor 432 rotates the waist member 232 and the arm 234 about the lift path L—L to position the first and second extensions 236a and 236b of the arm 234 at desired locations relative to the workpiece containers 114 (FIG. 1) and/or the processing stations 120 (FIG. 1). The first effector-drive 442a rotates the first end-effector 250a about the first rotation axis $A_1$—$A_1$, and the second effector-drive 442b rotates the second end-effector 250b about the second rotation axis $A_2$—$A_2$. The effector-drives 442a–b operate independently from each other and the waist motor 432 so that the end-effectors 250a and 250b can move in a compound motion with the arm 234. This motion can thus translate the workpieces 101 along virtually any desired path. Therefore, the waist motor 432 and the end-drives 442a–b can operate serially or in parallel to provide the desired motion of the end-effectors 250.

The robot unit 134 can also include a plurality of amplifiers to operate the motors carried by the robot unit 134. In this embodiment, the amplifiers can include four servoamplifiers 450 (identified by reference numbers 450a–d). The amplifiers 450 operate the lift actuator 412, the waist motor 432, and the effector-drives 442a–b. Additionally, the transport unit 134 can include a servoamplifier 452 for a rail motor (not shown) that moves the transport unit 210 along the track 132 (FIG. 1). The amplifiers 450 and 452 are controlled by a control circuit board (not shown in FIG. 4) that is carried by the transport unit 210 such that much of the wiring and the electronics for the robot unit 134 are carried locally with the transport unit 210. Some of the internal wiring for the waist motor 432 and the effector-drives 442a–b is carried in a flexible cable track 454 that moves vertically with the lift platform 416. This reduces the number of long wires running through the processing apparatus 100.

Figure 5:
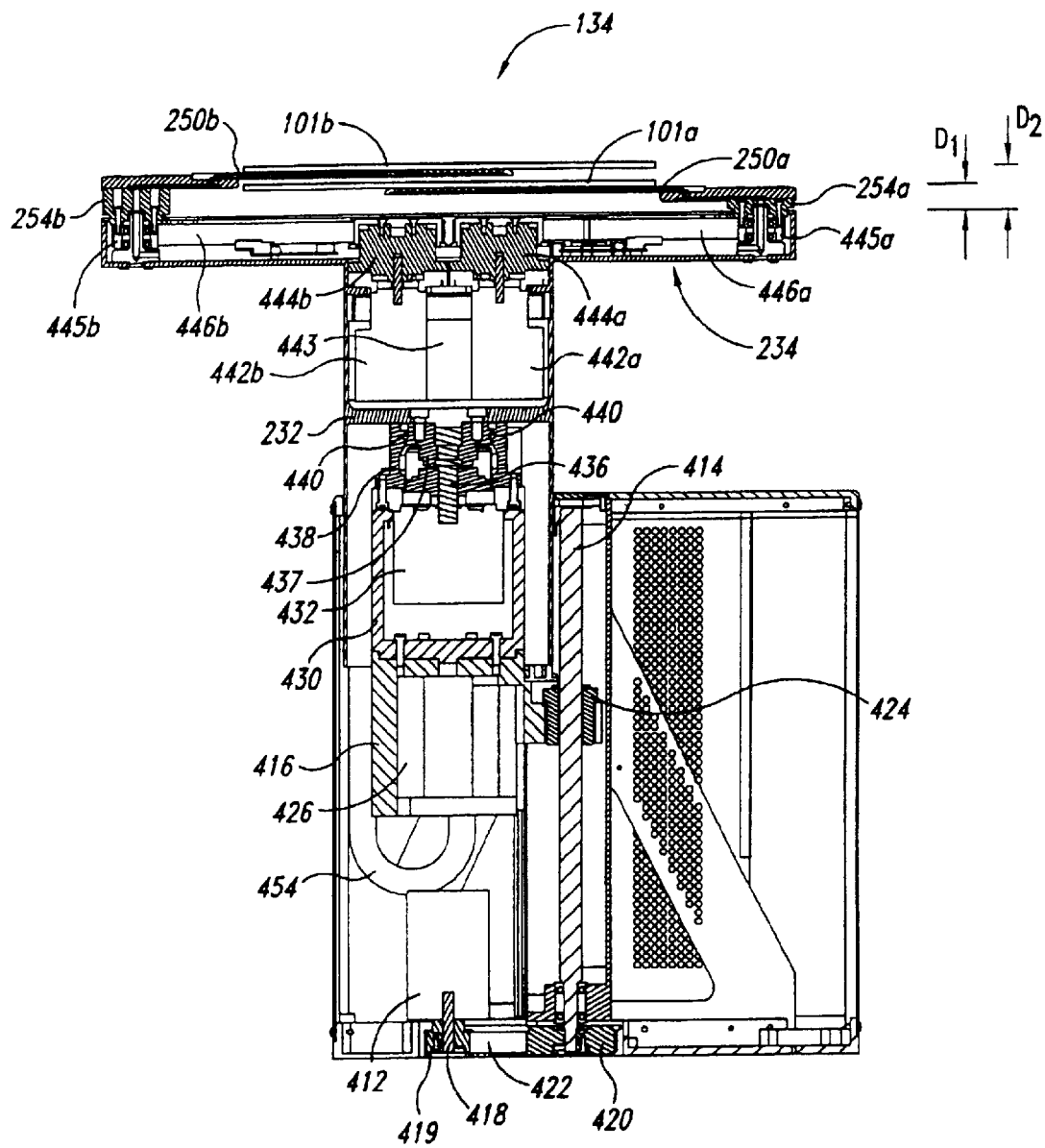
FIG. 5 is a cross-sectional view of the transfer device of FIG. 4.

FIG. 5 shows the first and second end-effectors 250a and 250b in a workpiece transport position. In this configuration, the first spacer 254a spaces the first end-effector 250a apart from the arm 234 by the first distance $D_1$ and the second spacer 254b spaces the second end-effector 250b apart from the arm 234 by the second distance $D_2$. When the first and second end-effectors 250a–b are over the arm 234, the first workpiece 101a can be superimposed under the second workpiece 101b for transportation along the track 132 as explained above with reference to FIG. 3B. It will be appreciated that the first and second end-effectors 250a and 250b can be spaced apart from the arm 234 by different distances and using different techniques. The particular embodiment shown in FIG. 5 uses fixed spacers 254a and 254b to provide a fixed differential in the elevation between the first and second end-effectors 250a and 250b that mitigates the need for complex collision avoidance algorithms because the first and second workpieces 101a–b are inherently held at elevations in which they cannot collide with one another or other components of the robot unit 134.

Figure 6:
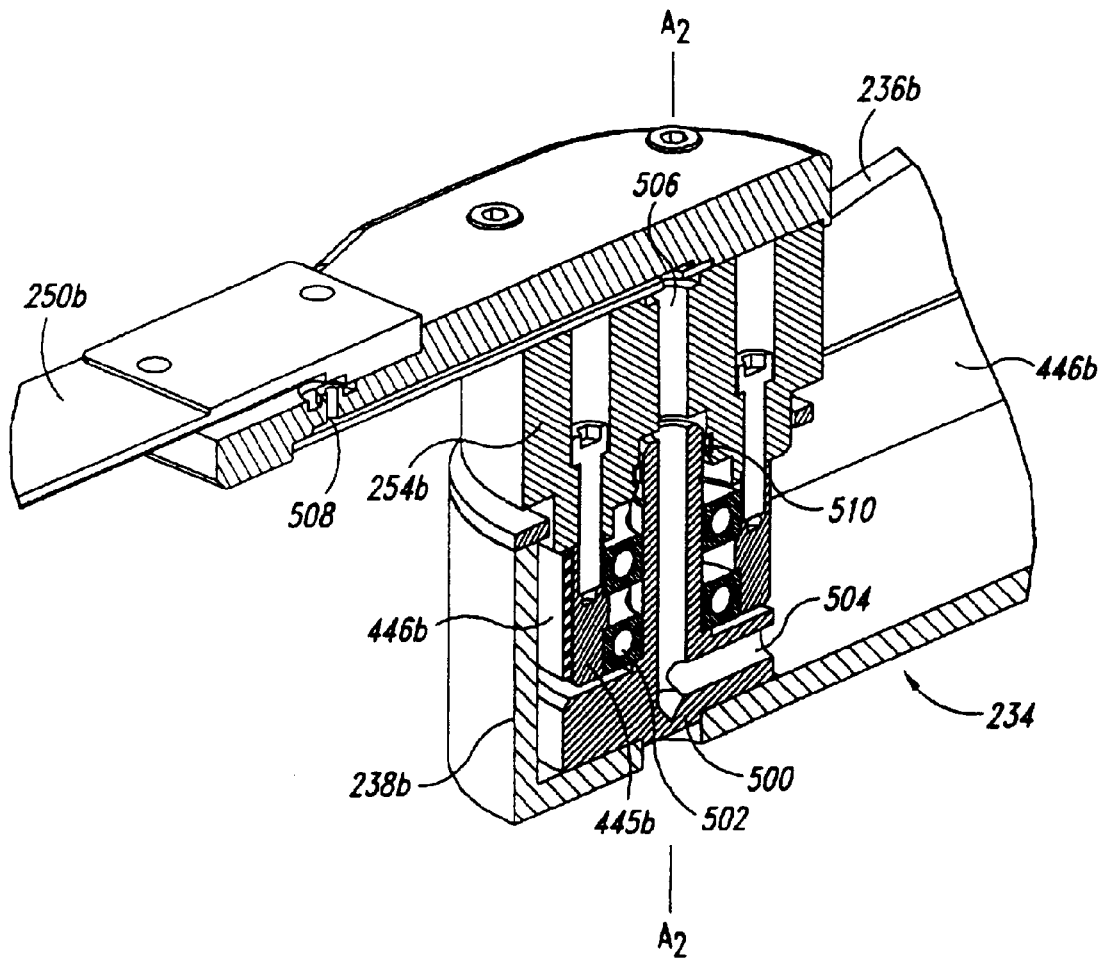
FIG. 6 is a cross-sectional view of an end-effector of the transfer device of FIG. 4.

FIG. 6 illustrates the connection between the second end-effector 250b and the second extension 236b of the arm 234 in greater detail. In this embodiment, the pulley 445b is fixedly attached to the spacer 254b, and a proximal end of the end-effector 250b is fixedly attached to the spacer 254b. The belt 446b accordingly rotates the pulley 445b about the second rotation axis $A_2A_2$. The pulley 445b is mounted to a rotary fluid pass through 500 by a bearing 502. The fluid pass through 500 includes a passageway 504 through which a vacuum can be drawn or a pressurized fluid can be pumped. The passageway 504 is in fluid communication with a passageway 506 in the spacer 254b and a passageway 508 through the end-effector 250b such that the fluid can flow through the second end-effector 250b. In the case of a vacuum end-effector, a vacuum can be drawn through the passageways 504, 506 and 508 to produce a suction at the workpiece holder 252 (FIG. 2A). A seal 510 between the fluid pass through 500 and the spacer 254b prevents leaks between these two components. It will be appreciated that alternate embodiments of applying a vacuum or driving a pressurized fluid through an end-effector can be accomplished using other structures. Additionally, the end-effectors can be vacuum end-effectors as shown or they can be edge grip end-effectors that use pressurized fluid to drive a linear plunger to hold the edge of the workpiece against protruding tabs (See, e.g., U.S. patent application Ser. Nos. 09/386,566; 09/386,590; and 09/386,568, all of which have been incorporated by reference above).

Several embodiments of the transfer device 130 are also expected to have a high degree of reliability. The transfer device 130 reduces the number of components and the complexity of the operating software compared to transfer devices that have a plurality of independent robot units in a single area. In general, devices that reduce the complexity of a system are more reliable and are easier to maintain because they have fewer components. Therefore, several embodiments of the transfer device 130 are expected to have low maintenance requirements and low down-time caused by component failures.

Figure 7:
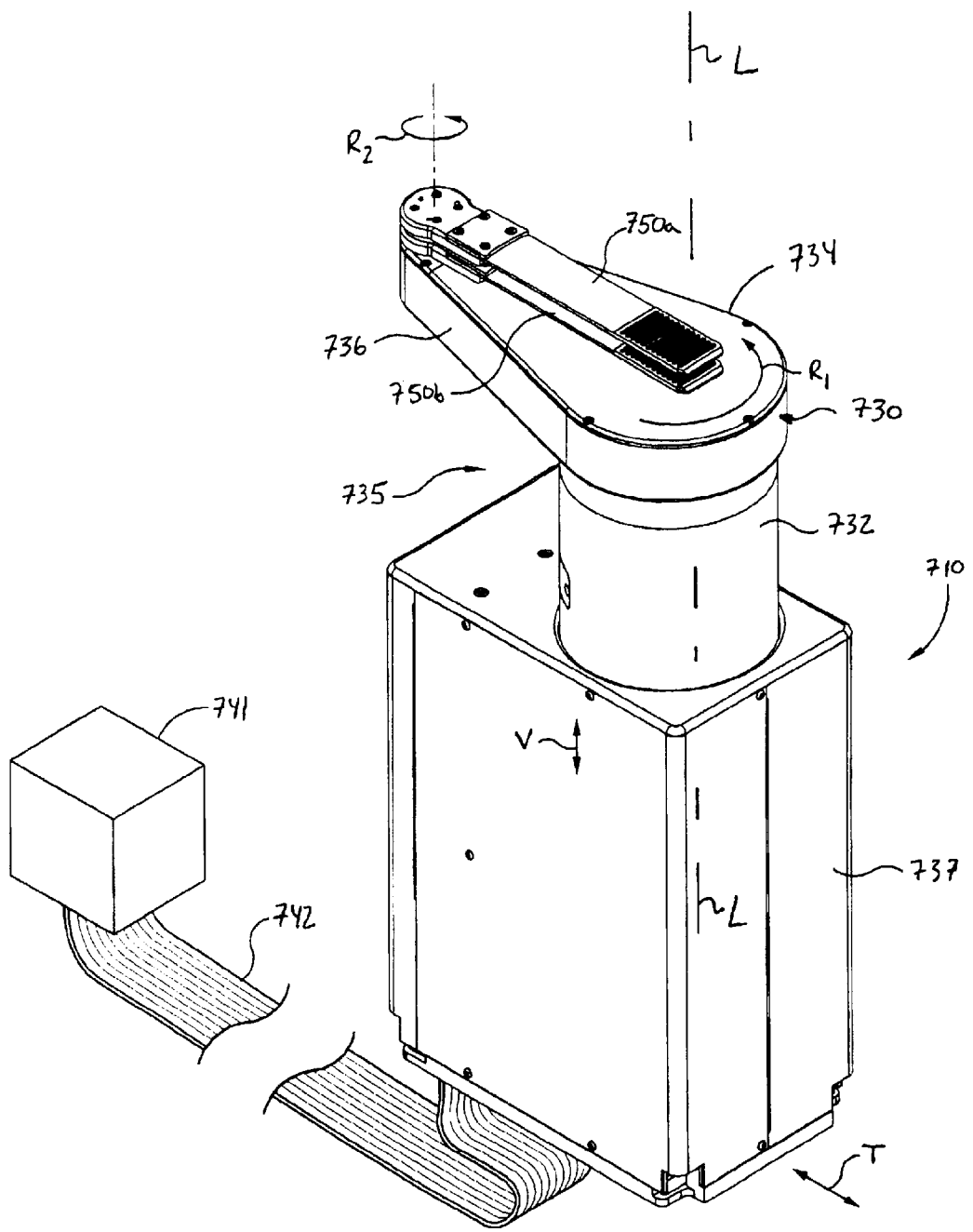
FIG. 7 is an isometric view of a transport unit having an arm with a single extension in accordance with another embodiment of the invention.

FIG. 7 is an isometric view of a transport unit 710 having an arm 734 with a single extension 736 in accordance with another embodiment of the invention. In one aspect of this embodiment, the transport unit 710 can include a robot unit 735 supported by a linear track 132 (FIG. 2A) to move linearly as indicated by arrow T. Accordingly, the robot unit 735 can be automatically moved into alignment with the load/unload station 110 (FIG. 1) and any of the processing stations 120 (FIG. 1). The robot unit 735 can include a base 737 that supports a waist member 732 for upward and downward motion along the lift path L—L, as indicated by arrow V and as described above with reference to FIG. 2A. The waist member 732 can support an arm assembly 730 having an arm 734 that rotates relative to the base 737, as indicated by arrow $R_1$. In one embodiment, the arm 734 can have a single, eccentric extension 736 that projects away from the lift path L—L, and that supports two end-effectors 750 (shown as a first end-effector 750a and a second end-effector 750b). The end-effectors 750 can rotate independently of each other relative to the arm 734 about a common axis, as indicated by arrow $R_2$.

In one aspect of this embodiment, the robot unit 735 can be coupled to a control unit 741 (shown schematically in FIG. 7) with a flexible cable 742 (such as a ribbon cable). The robot unit 735 can accordingly move linearly as indicated by arrow T without restriction from the cable 742. In a further aspect of this embodiment, a significant portion of the control and power circuitry required to operate the robot unit 735 can be positioned in the control unit 741 rather than on the robot unit 735 itself. An advantage of this arrangement is that the robot unit 735 can be made smaller and can accordingly require less space in which to move.

Figure 8:
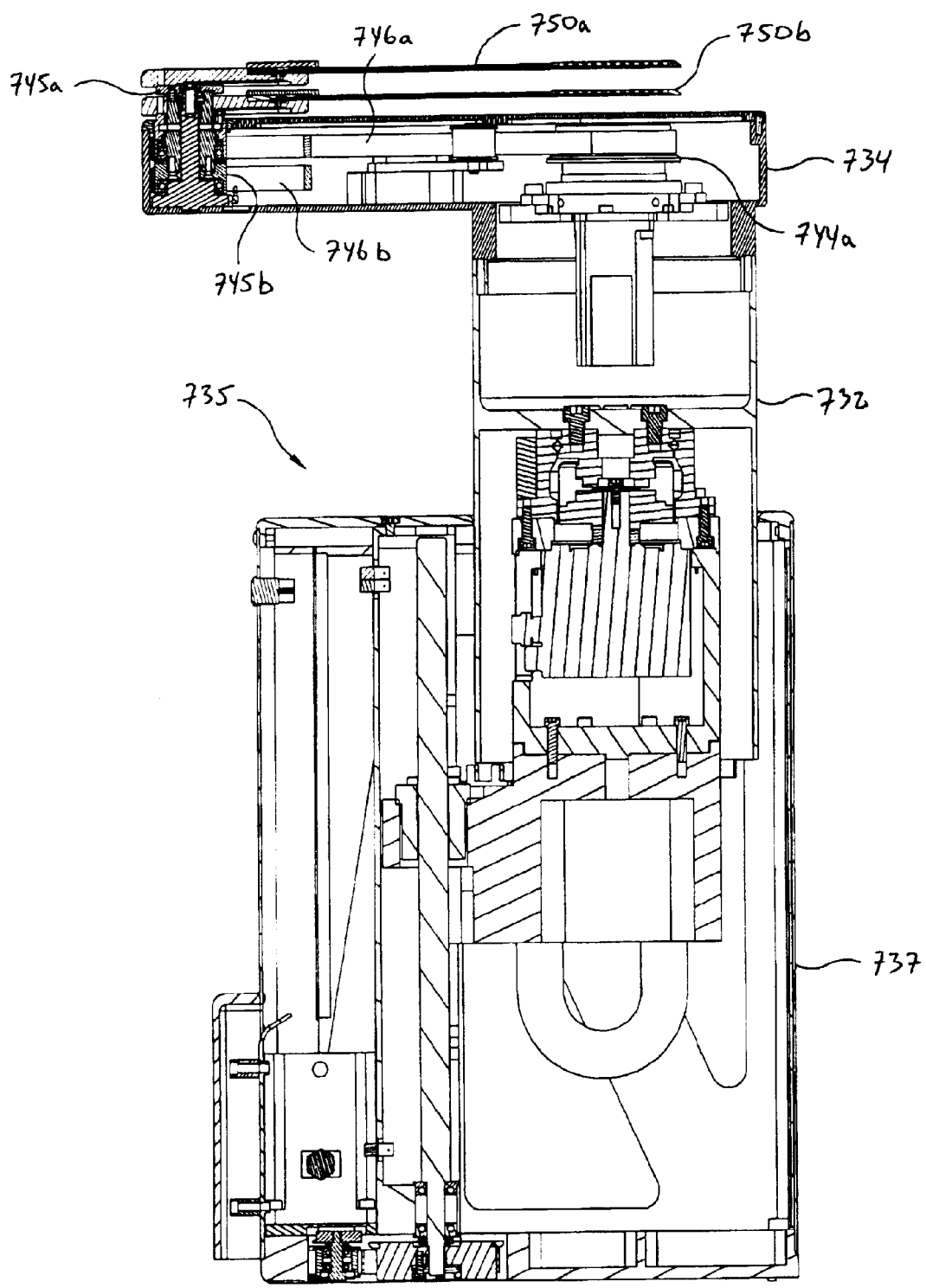
FIG. 8 is a cross-sectional view of an embodiment of the transport unit shown in FIG. 7.

FIG. 8 is a partially schematic, cross-sectional side view of the robot unit 735 in accordance with an embodiment of the invention. In one aspect of this embodiment, the first end-effector 750a is supported on an inner shaft 745a and the second end-effector 750b is supported on an outer shaft 745b disposed outwardly from the inner shaft 745a. The outer shaft 745b can be driven by an outer shaft belt 746b (extending out of the plane of FIG. 8) which can in turn be driven by an outer shaft pulley (positioned out of the plane of FIG. 8). The inner shaft 745a can be coupled to an inner shaft belt 746a which can in turn be powered by an inner shaft pulley 744a. Because the first end-effector 750a is vertically spaced apart from the second end-effector 750b, each end-effector 750 can move without interfering with the movement of the other. By providing independent power transmission to each end-effector 750, each end-effector 750 can move independently of the other.

One feature of an embodiment of the robot unit described above with reference to FIGS. 2B, 7 and 8 is that the single eccentric extension 736 can be less likely than multiple projection arrangements to interfere with surrounding components when the arm 734 rotates. Conversely, an advantage of arms having multiple extensions is that they can effectively increase the reach of the robot unit. Accordingly, the particular type of arm arrangement can be selected based, for example, on the particular arrangement of the processing stations 120 and the load/unload station 110. In one particular embodiment, a robot unit 735 having a single extension 736 can be suitable for a tool having a single row of processing stations, such as that disclosed in U.S. patent application Ser. No. 10/080,914, entitled "METHOD AND APPARATUS FOR MANUALLY AND AUTOMATICALLY PROCESSING MICROELECTRONIC WORKPIECES," filed concurrently herewith and previously incorporated herein in its entirety by reference.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method for processing a microelectronic workpiece in a processing apparatus having a set of processing stations in a row, the method comprising:

holding a first microelectronic workpiece with a first end-effector connected directly to a pivot point along a fixed-length section of an arm that projects directly from a member which moves along and rotates about a lift path;

holding a second microelectronic workpiece with a second end-effector connected directly to the pivot point along the fixed-length section of the arm;

positioning the first microelectronic workpiece in a first plane a first distance from the arm and positioning the second microelectronic workpiece in a second plane a second distance from the arm, the second distance being different than the first distance; and rotating the first end-effector and/or the second end-effector to position the first and second microelectronic workpieces over the arm such that at least a portion of the first microelectronic workpiece is under at least a portion of the second microelectronic workpiece.

2. A method for processing a microelectronic workpiece in a processing apparatus having a set of processing stations in a row, the method comprising:

holding a first microelectronic workpiece with a first end-effector connected directly to a pivot point along a fixed-length section of an arm that projects directly from a member which moves along and rotates about a lift path;

holding a second microelectronic workpiece with a second end-effector connected directly to the pivot point along the fixed-length section of the arm; and positioning the first microelectronic workpiece in a first plane a first distance from the arm and positioning the second microelectronic workpiece in a second plane a second distance from the arm, the second distance being different than the first distance; and rotating the first end-effector and/or the second end-effector to position the first and second microelectronic workpieces over the arm such that the first microelectronic workpiece is superimposed relative to the second microelectronic workpiece.

3. A method for processing a microelectronic workpiece in a processing apparatus having a set of processing stations in a row, the method comprising:

holding a first microelectronic workpiece with a first end-effector connected directly to a pivot point along a fixed-length section of an arm that projects directly from a member which moves along and rotates about a lift path;

holding a second microelectronic workpiece with a second end-effector connected directly to the pivot point along the fixed-length section of the arm;

positioning the first microelectronic workpiece in a first plane a first distance from the arm and positioning the second microelectronic workpiece in a second plane a second distance from the arm, the second distance being different than the first distance;

rotating the first end-effector and/or the second end-effector to position the first and second microelectronic workpieces over the arm such that the first microelectronic workpiece is superimposed relative to the second microelectronic workpiece; and moving the arm along a linear track proximate to the row of processing stations, the movement of the arm moving both the first and second workpieces together along the track.

* * * * *